United States Patent
Fischione et al.

(10) Patent No.: US 7,219,565 B2
(45) Date of Patent: May 22, 2007

(54) SPECIMEN HOLDING APPARATUS

(75) Inventors: Paul E. Fischione, Export, PA (US); Jeff Gronsky, Ligonier, PA (US)

(73) Assignee: E.A. Fischione Instruments, Inc., Export, PA (US)

( * ) Notice: Subject to any disclaimer, the term of this patent is extended or adjusted under 35 U.S.C. 154(b) by 84 days.

(21) Appl. No.: 10/409,347

(22) Filed: Apr. 7, 2003

(65) Prior Publication Data
US 2004/0003666 A1 Jan. 8, 2004

Related U.S. Application Data

(60) Provisional application No. 60/370,843, filed on Apr. 8, 2002.

(51) Int. Cl.
*G01L 1/22* (2006.01)
*G01N 3/02* (2006.01)

(52) U.S. Cl. ................................. 73/862.474; 73/865

(58) Field of Classification Search ................. 73/760, 73/863, 864–864.02, 856–860, 862.474
See application file for complete search history.

(56) References Cited

U.S. PATENT DOCUMENTS

| | | | | |
|---|---|---|---|---|
| 2,368,900 A | * | 2/1945 | Templin | 73/856 |
| 4,103,643 A | * | 8/1978 | Staunton | 118/50 |
| 4,596,934 A | * | 6/1986 | Yanaka et al. | 250/442.11 |
| 4,662,229 A | * | 5/1987 | Curtis | 73/859 |
| 4,840,070 A | * | 6/1989 | Ralfs et al. | 73/818 |
| 4,954,712 A | | 9/1990 | Wilcox | |
| 5,280,178 A | * | 1/1994 | Engelen et al. | 250/440.11 |
| 5,297,441 A | * | 3/1994 | Smith et al. | 73/860 |
| 5,406,087 A | | 4/1995 | Fujiyoshi et al. | |
| 5,463,223 A | * | 10/1995 | Wong et al. | 250/339.12 |
| 5,528,942 A | * | 6/1996 | Baratta | 73/856 |
| 5,877,427 A | * | 3/1999 | Trate et al. | 73/800 |
| 5,877,432 A | * | 3/1999 | Hartman et al. | 73/862.69 |
| 5,945,607 A | * | 8/1999 | Peppel et al. | 73/856 |
| 5,965,823 A | * | 10/1999 | Ryan et al. | 73/860 |

OTHER PUBLICATIONS

"Single Tilt Cooling," Gatan Model 630 High Tilt Tomography Cryotransfer System, Bulletin No. DS630063098.
"Single Tilt/Double Tilt Analytical Holders for TEM," Gatan Model 643 Single Tilt and Model 646 Double Tilt Holder, Bulletin No. DS643/643 040196.
"TECNAI CompuStage Specimen Holder," FEI Company, Mar. 31, 2003.

* cited by examiner

*Primary Examiner*—Max Noori
(74) *Attorney, Agent, or Firm*—Metz Lewis LLC; Barry I. Friedman

(57) ABSTRACT

A specimen holding apparatus includes a main body, a specimen supporting surface provided on the main body, and a restraining element movable along the main body in a direction substantially parallel to the longitudinal axis of the main body from a first position in which the restraining element is removed from the specimen supporting surface to a second position in which the restraining element encroaches over the specimen supporting surface. An alternate specimen holding apparatus includes a main body, a specimen supporting surface provided on the main body in a first horizontal plane, and a restraining element attached to the main body that is rotatable in a second horizontal plane substantially parallel to the first horizontal plane between a first position in which the restraining element is removed from the specimen supporting surface and a second position in which the restraining element encroaches over the specimen supporting surface.

29 Claims, 3 Drawing Sheets

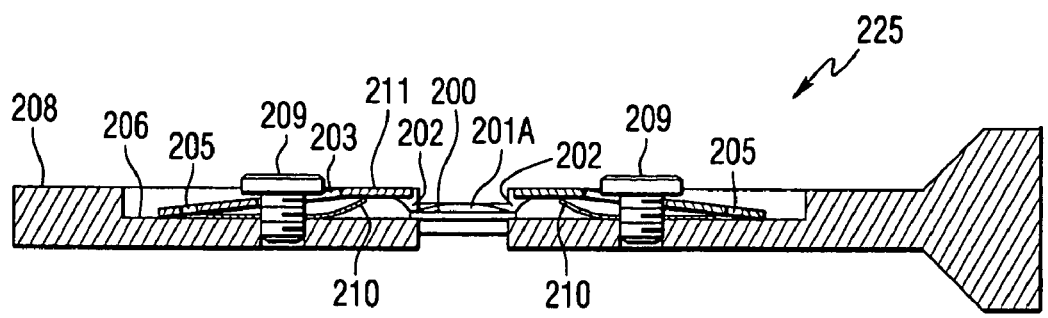
FIG. 6
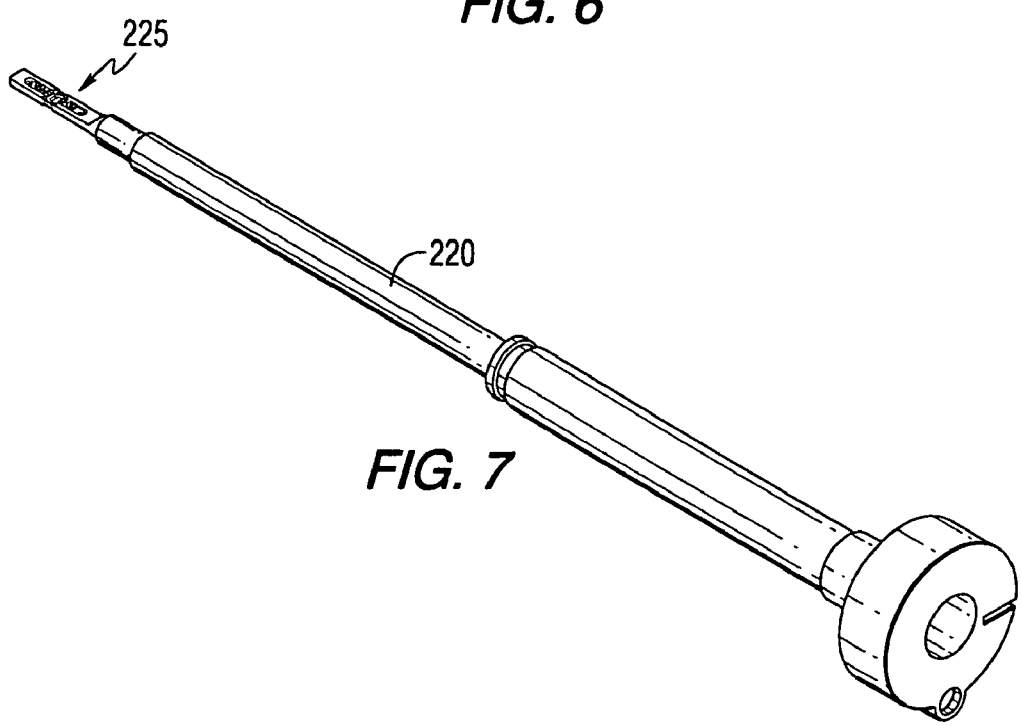
FIG. 7
FIG. 8

SPECIMEN HOLDING APPARATUS

CROSS REFERENCE TO RELATED APPLICATION

This application claims the benefit of U.S. Provisional Application No. 60/370,843 filed on Apr. 8, 2002.

FIELD OF THE INVENTION

The present invention relates to a specimen holding apparatus for retaining a specimen while being viewed or imaged in a microscope system such as a charged particle beam device.

BACKGROUND OF THE INVENTION

FIG. 1 is a diagram of a typical prior art charged particle beam device 1, such as an electron microscope, which is described in Engelen et al., U.S. Pat. No. 5,280,178. The charged particle beam device 1 includes a column 3 capable of being evacuated to, for example, $10^{-7}$ Torr. An electron source 5 emits an electron beam along an optical axis 7, which beam is imaged on a specimen 11 by way of a dual condensor system 8 and an objective lens 9. The lower portion of objective lens 9, together with a diffraction lens, an intermediate lens and two projector lenses, all diagrammatically represented by the lens 10, form an image of the specimen 11 on a target 20 with a magnification of, for example $10^6$.

In a microscope system such as charged particle beam device 1, the specimen 11 is typically supported by a specimen holder 13. The specimen holder 13 is connected to the column 3 through spherical bearing 17 so that specimen holder 13 can be displaced relative to the optical axis 7 over a distance of approximately 1 mm in a direction parallel to the optical axis 7 and also over a distance of approximately 1 mm in a direction which is normal to the optical axis 7. In addition, the specimen 11 may tilted by rotation of the specimen holder 13 about its axis. Tilting of the specimen 11 is important in order to obtain a number of images of the specimen 11 with different orientations at different angles. Such multi-angle imaging may be used for reconstruction of a three dimensional image of the specimen 11, for examination of diffraction images of the specimen 11, or, in the case where material analysis of the specimen 11 is being conducted, for optimizing the signal from an X-ray detector which can be arranged adjacent the upper poleshoe 9a of the objective lens 9 and which detects the X-rays generated in the specimen 11 by the electron beam.

According to the Rayleigh theory, the dimension of the smallest observable details in the specimen 11 is proportional to $\lambda/a$, where a is the numerical aperture of the objective lens 9 and $\lambda$ is the wavelength of the electrons. For an electron energy amounting to 300 kV, the wavelength amounts to approximately $2\times10^{-3}$ nm. Because of the spherical aberration caused by the objective lens 9, such a resolution cannot be achieved because a point situated on the optical axis 7 is imaged by the objective lens 9 as a spot having a diameter proportional to $C_s a^3$. Therein, $C_s$ is the spherical aberration coefficient. A minimum resolution is obtained when the numerical aperture a is chosen between an as low as possible value for reducing the spherical aberration and an as high as possible value for maximizing the resolution according to Rayleigh. The dimension of the smallest observable details is then 0.067 $C_s^{1/4}\lambda^{1/4}$. For high-resolution electron microscopes, a resolution of 0.17-0.20 nm can be achieved for a spherical aberration coefficient value of 1 mm. Such a low aberration coefficient can be achieved by making the distance between the poleshoes 9a and 9b equal to 1 mm. Because of the small poleshoe distance required for a high-resolution, the part of the specimen holder 13 to be introduced between the poleshoes must be very thin. Moreover, the specimen holder 13 must be sufficiently rigid to prevent image-disturbing vibrations of the specimen 11. It must also be possible to attach a specimen 11 which comprises, for example, a carbon film having a thickness of 20 nm, supported on a circular metal mesh commonly known as a grid, to the specimen holder 13 in a simple manner without causing damage to the specimen 11.

FIG. 2 is an isometric diagram of prior art specimen retaining device 21 that may form part of specimen holder 13 for holding specimen 11 in charged particle beam device 1. The specimen retaining device 21 is described in U.S. Pat. No. 5,280,178, and includes a supporting face 23 against which the specimen 11 may rest. The specimen 11 may be clamped against supporting face 23 by resilient retaining element 25, which comprises a contact portion in the form of an annular central portion 27 and three arms 29a, 29b and 29c. Each arm 29 includes a lug 31 which can resiliently engage a circumferential edge 33 of specimen retaining device 21. One of the lugs 31 is provided with detachment portion 35 for facilitating detachment of retaining element 25. Supporting face 23 is recessed relative to upper surface 39 of specimen retaining device 21 such that retaining element 25 bears against upright positioning edge 41 of specimen retaining device 21. A circular specimen 11 may thus be located on the plane of the supporting face 23 by the vertical edge 41, which comprises several sections of a cylindrical surface, and will be held in place by retaining element 25.

FIG. 3 is an isometric diagram of an alternate specimen retaining device 21 described in U.S. Pat. No. 5,280,178. A specimen 11 in this embodiment is clamped against the supporting face 23 by resilient tongues 43 and 45 with a resilient force, providing the well-known advantages of resilient clamping.

Specimen retaining device 21 shown in FIG. 2 has some tolerance to specimens of varying heights, and also has a rather low profile. However, it has proven difficult to use by some operators because of its requirement to align three points of engagement simultaneously between the clip 27 and the body 39. Further, it imposes a finite limit to the tilt-angles at which a specimen may be observed, since it presents a raised structure above the specimen around the entire perimeter of the specimen 11, and it requires a supporting structure below the specimen around the entirety of its perimeter. In the device 21 shown in FIG. 3, because the resilient tongues 43 and 45 are positioned at discrete locations around the perimeter of the specimen, they can be arranged so as not to interfere with viewing the specimen at high tilt angles when tilted about at least one axis. However, this approach suffers from the disadvantage that the specimen must be slid underneath the clips simultaneously to experience a restraining force from the clips. This situation makes loading difficult, and can easily damage a fragile specimen.

A further alternative device for retaining and supporting a specimen is taught in Yanaka et al., U.S. Pat. No. 4,596,934. In this device, a specimen to be examined is placed on a circular specimen grid, and the grid is positioned within a cylindrical counterbore formed within a moveable specimen holder that may form a part of or be utilized in the manner of specimen holder 13 described in connection with FIG. 1. A C-shaped retaining spring is described which snap-fits into a corresponding internal groove formed within the specimen holder. This mechanism has limited ability to restrain specimens of varying thickness, and the C-shaped retaining spring has been found to be difficult to handle by some operators.

Another well known prior art method and device for restraining a specimen utilizes an externally-threaded ring which mates with internal threads formed in the body of the specimen holder. This mechanism can easily damage fragile specimens due to the rigid nature of the screw threads. Further, some applications require observing the specimen at high angles from normal (i.e., nearly parallel to its surface), for instance in order to re-construct a three-dimensional model using observations at multiple angles. The threaded ring presents a high profile normal to the plane of specimen support such that it obscures the view of the specimen at high angles and constrains observation to a limited range of angles. That is, the field of view on the specimen is a circle at a normal beam incidence, and is gradually reduced or "shadowed" into a cat's-eye shape by the threaded ring as the holder is tilted, until the field of view becomes negligible at a modest tilt angle, e.g., +/−50 degrees from normal.

Yet another prior art device for restraining a specimen is shown in FIG. 4. This device uses levers that can pivot about axes oriented parallel to the plane of specimen support in such a way that one end of each lever can contact the top surface of the specimen and bring a substantially normal restraining force to bear on it. Specifically, referring to FIG. 4, a supporting face 100 is the primary locating surface for the specimen. Jaws 103 and 104, forming a part of the levers, can be rotated around hinges 105 and 106 so as to press against the specimen with a force substantially normal to face 100. The force is applied and controlled by way of wire legs 101 and 102, which are made of a resilient material, to provide the known advantages of resilient clamping. For high-tilt viewing of the specimen, this geometry has the advantage that the levers comprising jaws 103 and 104 and wire legs 101 and 102 can occupy discrete positions around the perimeter of the specimen, and can be arranged so as not to interfere with viewing of the specimen at glancing angles when tilted about at least one axis. That is, the specimen may be tilted about at least one axis without any line-of-sight obstruction of a central area by the restraining mechanism. A commercial example of such a device, the model 670 Ultra High Tilt Holder sold by Gatan, Inc., is advertised to have the ability to tilt to +/−80 degrees from normal incidence without obscuring the specimen. However, the same pivoting motion that applies the restraining force is also used to retract the tips of the levers, i.e., jaws 103 and 104, away from the specimen area during loading and un-loading. Therefore, it is difficult for an operator to pause and inspect the positioning of the specimen and the levers prior to applying the restraining force. Also, in order to lift the jaw 103 and 104 of each lever away from the specimen, the wire legs 101 and 102 of each lever must pivot below the plane of specimen support, making it difficult for an operator to manipulate with precision. Adding to this difficulty is the fact that the operator is required to manipulate the wire legs 101 and 102 from the side opposite that from which the specimen is installed. Further, this device is difficult to make small, so as to fit easily in narrow spaces such as typically encountered in charged-particle instruments such as electron microscopes.

Another known form of specimen retention consists of two planar supporting surfaces, located substantially in a single plane, with means such as screws and washers for affixing each of two opposite ends of a specimen (usually in the form of a ribbon) to the two aforementioned planar surfaces. This is typically a feature of so called straining holders, in which one of the surfaces is movable so as to stretch the specimen while under observation. Known straining holders require the clamping mechanism to be removed entirely for the purpose of loading a specimen, and so are cumbersome to use.

All of these prior art specimen restraining devices use a stationary supporting face located below the specimen, and a moveable or removable restraining element located above the specimen. It is appreciated that the ability to view the specimen at high angles of tilt is affected both by the shape and dimensions of the restraining element(s) and the shape and dimensions of the supporting structure below the specimen. Hence, it is desired to make each of these elements as thin as practical to achieve viewing at high tilt, as the thickness of each will limit the practical viewing angle. However, it is also understood that the design and physical characteristics of the restraining element impose restrictions on the design and physical characteristics of the supporting structure, so that these elements are not independent of one another. For example, a threaded-ring restraining element requires mating threads in the counterbore, and exerts downward force via the specimen onto the supporting surface. The supporting structure must therefore be sufficiently large and strong to resist said force without permanent deformation. Likewise, a resilient supporting mechanism produces forces within the structure of the holder, which forces must be borne by the holder without permanent distortion.

SUMMARY OF THE INVENTION

It is an object of the present invention to provide a specimen holder having the benefits of previously-known resilient restraining devices and methods, while making simpler and more reliable the process of installing and removing specimens, without compromise of the capability for observation over a wide range of tilt angles. The restraining-device system of the invention provides for precise visual alignment with the specimen, prior to application of any force on the specimen. Further, the present invention provides for loading and un-loading of specimens through operator access to the top side only of the holder; this will be recognized as an advantage to the operator by those skilled in the art of, e.g., electron microscopy. In addition, the invention provides for improved distribution of restraining forces over the surface of the specimen. This results in gentle restraint of fragile specimens, as well as the capability to restrain specimens with uneven surfaces.

In accordance with one embodiment of the invention, a specimen holding apparatus includes a main body having a specimen supporting surface, preferably circular in shape, having a raised edge around a portion of its perimeter. The raised edge forms a cylindrical surface that constrains the specimen to a known position in the plane of the supporting surface. One or more conical-shaped surfaces extend upwardly from the top of the raised edge to assist the operator in guiding the specimen into its desired position. One or more resilient restraining elements are positioned around the perimeter of the specimen area and are moveable along the longitudinal axis of the main body of the apparatus. Preferably, each restraining element is located in a groove that constrains its motion to a path such that it can overlap the specimen or can be withdrawn from overlapping the specimen. Each restraining element is preferably provided with a biasing element such as a spring that lifts the specimen-contacting portion of the restraining element away from the top of the supporting surface during movement of the restraining element. Each restraining element has an actuating attachment device, such as a screw, which can be used by the operator to control and apply a restraining force to the specimen against the force of the spring element and substantially normal to the plane of specimen support. Each restraining element preferably further includes a grasping element, such as a raised tab or peg or most preferably a hole, so that the operator can easily move the restraining element when the restraining force is removed. The invention has the advantage that the restraining elements can be put forth and withdrawn, and the restraining force can be applied and removed all from one direction relative to the holder. The specimen-contacting portion of each restraining element is, in a preferred embodiment, divided into discrete fingers so that each exerts a separate restraining force on a discrete location of the specimen. This is an advantage in case of oddly-shaped or fragile specimens, which are known to suffer damage or poor retention by other methods. The fingers can be formed, for example, by cutting slots into a single sheet of material, by welding small resilient wires to protrude past the edge of a sheet of material, or by other methods which will be apparent to those skilled in the art. The restraining elements, springs and supporting structure are preferably made from materials that are non-magnetic such as phosphor-bronze or beryllium-copper. The specimen-contacting portion of each restraining element preferably overlaps the specimen by 0.5 mm, for example, to provide sufficient engagement for secure retention while remaining outside of the desired viewing area. The geometry and materials of the restraining elements should be chosen to provide a restraining force sufficient to secure the specimen positively, such as 5 grams force, but small enough so as not to jeopardize damaging the specimen, such as not more than 20 grams force.

Another embodiment of the invention provides for each restraining element to be withdrawn from the specimen area by way of rotation in a plane parallel to the plane of specimen support. Other features and benefits of the specimen holder remain substantially the same. In this case, the operator can separately install the specimen to position, swing the restraining elements into a desired position, and apply a restraining force to the specimen using each restraining element.

In the present invention, the restraining element(s) can be positioned at discrete locations about the perimeter of the specimen in such a way so as not to shadow the specimen appreciably regardless of the angle through which the specimen is tilted about one axis. Therefore, the angles through which the specimen may be viewed without obstruction are dictated essentially by the supporting structure only. This in turn can be thinned selectively to provide, for example, +/−80 degrees tilt when using a disk-shaped specimen of 3 mm diameter.

Those skilled in the art will recognize that while specific implementations have been described herein, many others are possible in keeping with the ideas and approaches presented.

BRIEF DESCRIPTION OF THE DRAWINGS

Further features and advantages of the present invention will be apparent upon consideration of the following detailed description of the present invention, taken in conjunction with the following drawings, in which like reference characters refer to like parts, and in which:

FIG. 6 is a cross-sectional diagram of the specimen holding apparatus shown in FIG. 5 taken along lines A-A of FIG. 5;

FIG. 7 is an isometric view of the specimen holding apparatus shown in FIGS. 5 and 6 affixed to a cylindrical shaft having an axis parallel to the plane of specimen support; and FIG. 8 is a top plan view of a specimen holding apparatus in accordance with a second embodiment of the present invention.

DESCRIPTION OF THE PREFERRED EMBODIMENTS

Figure 1:
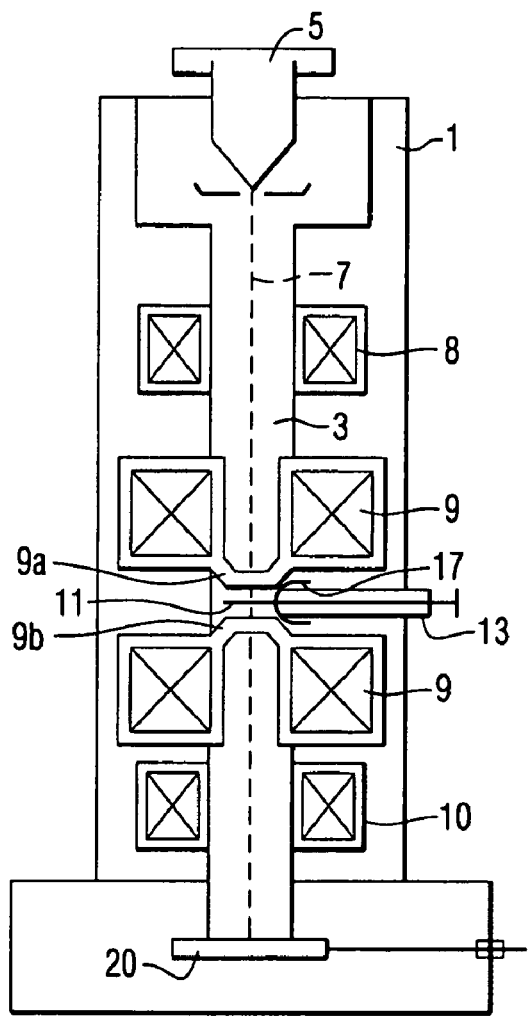
FIG. 1 is a diagram showing selected components of a prior art charged particle beam device, such as an electron microscope.
Figure 2:
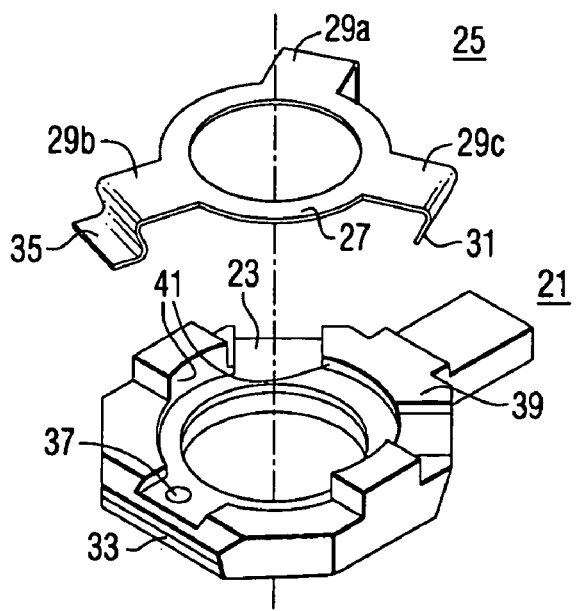
FIG. 2 is an isometric view of a prior art specimen retaining device.
Figure 3:
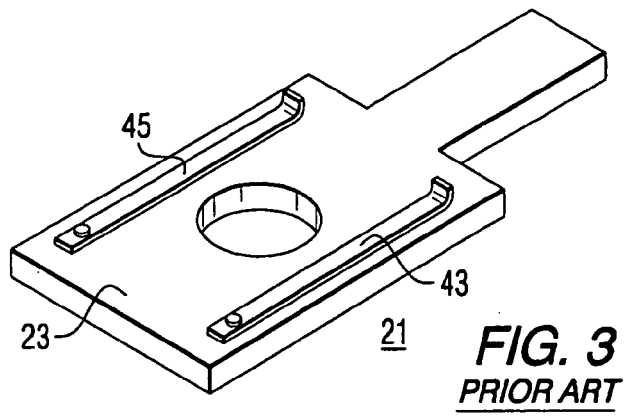
FIG. 3 is an isometric view of another prior art specimen retaining device.
Figure 4:
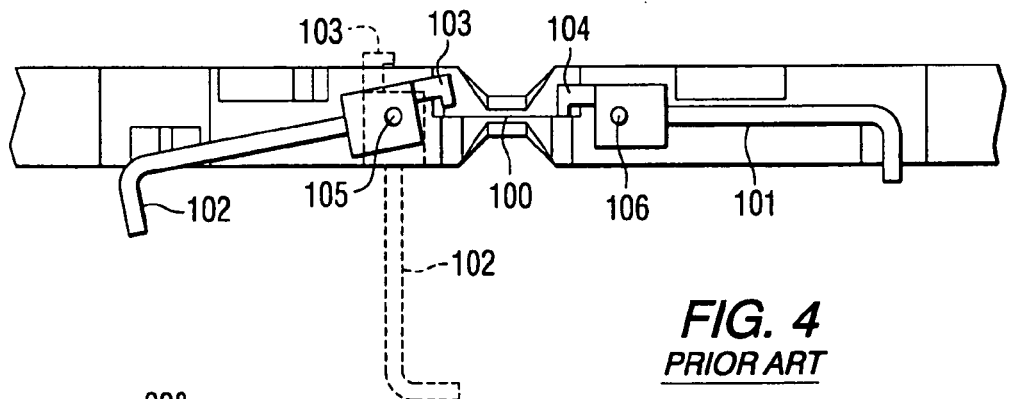
FIG. 4 is a cross-sectional diagram of yet another prior art specimen holder that uses levers that pivot around axes oriented parallel to the plane of specimen support.
Figure 5:
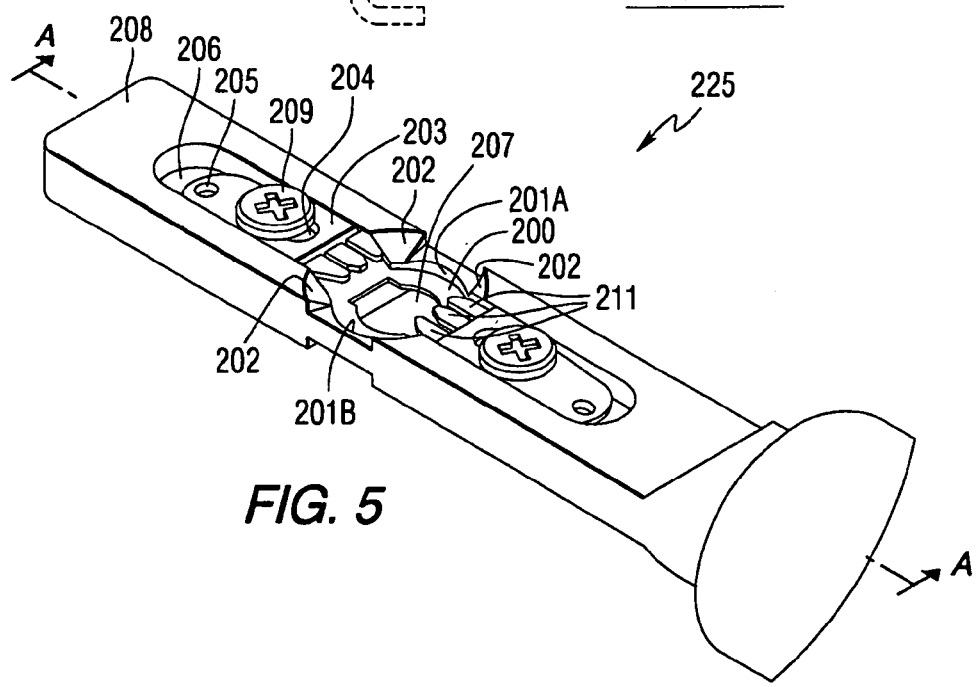
FIG. 5 is an isometric view of a specimen holding apparatus in accordance with a first embodiment of the present invention.

FIG. 5 is an isometric view of a specimen holder 225 according to a first embodiment of the present invention. FIG. 6 is a cross-sectional diagram of the specimen holder 225 shown in FIG. 5 taken along lines A-A of FIG. 5. Specimen holder 225 includes a circular supporting surface 200 for supporting a circular specimen to be viewed or imaged in a microscope system such as a charged particle beam device. Supporting surface 200 is partially bounded by edges 201A and 201B extending vertically from supporting face 200 on opposite sides of supporting surface 200. Edges 201A and 201B each comprise sections of a cylindrical surface. Conical portions 202 extend from the top of edges 201A and 201B, thereby leaving a cut-out region in between conical portions 202, which cut-out region promotes viewing of a specimen at high tilt angles. Conical portions 202 also serve to guide a specimen into the region of the supporting surface 200 bounded by the edges 201A and 201B. Restraining elements 203 are arranged in and moveable within grooves 206 provided in main body 208 of specimen holder 225. Grooves 206 constrain the motion of restraining elements 203 to a first translation direction generally toward and away from supporting surface face 200, generally parallel to a longitudinal axis of main body 208, and generally perpendicular to a second direction between a center point of edge 201A and a center point of edge 201B. Restraining elements 203 are held into grooves 206 by screws 209 and oppose the biasing action of springs 210, or similar biasing elements, positioned beneath restraining elements 203 as seen in FIG. 6. Alternatively, a cam, a wedge, or other suitable attachment device may be used instead of screw 209 to hold each restraining element 203 in place. Springs 210 are preferably made of a non-magnetic spring material such beryllium-copper. It is preferable that restraining elements 203 be provided with slots 204 therein that extend along a body portion thereof and that function to limit the motion of restraining elements 203 within grooves 206 by contacting screws 209. Springs 210 tend to lift the restraining elements 203 away from the bottom of grooves 206, while screws 209 limit the extent of this lift and may be used to adjust the free position of restraining elements 203. Restraining elements 203 are preferably provided with holes 205 or another grasping element such as a raised tab or peg, which permit the operator to grasp restraining elements 203 in an area remote from the specimen. In a forward position, restraining elements 203 encroach over the perimeter of supporting surface 200, whereas in a withdrawn position, restraining elements 203 are retracted from supporting surface 200 so as not to intersect the projection of supporting surface 200 in a direction normal to its own surface. Although specimen holder 225 is shown in FIGS. 5 and 6 as having two restraining elements, it will be appreciated by those of skill in the art that specimen holder 225 may be provided with only a single restraining element 203 without departing from the scope of the present invention.

In practice, the operator first loosens screws 209 and then retracts restraining elements 203 away from supporting surface 200. The operator then places a specimen onto supporting surface 200 and pushes restraining elements 203 to a position overlapping a portion of the specimen. In this position, the operator can inspect the alignment of all components, particularly the position of restraining elements 203 relative to the specimen, prior to applying a restraining force on the specimen. Next, the operator tightens screws 209, whereby a downward force is selectively applied to restraining elements 203 and to the specimen. The amount of force applied to the specimen may be controlled by way of a torque-limiting device forming a part of the screwdriver used to tighten screws 209, or by the inherent compliance of restraining elements 203, as for example by the elastic bending of fingers 211 in contact with the specimen. In a preferred embodiment, the force is transmitted to the specimen by way of a plurality of fingers 211 provided at the end of restraining elements 203. Fingers 211, which are preferably flexible in nature, provide multiple contact points with the specimen, even for specimens having a rough or uneven surface. Fingers 211 can be formed, for example, by cutting slots into a single sheet of material, by welding small resilient wires to protrude past the edge of a sheet of material, or by other methods which will be apparent to those skilled in the art. Hole 207 is preferably provided in main body 208 to allow a charged particle beam to pass through the specimen and specimen holder 225 and be observed, as is required in the operation of a charged particle beam device such as an electron microscope.

The specimen-contacting portion of each restraining elements 203 preferably overlaps the specimen by, for example, 0.5 mm to provide sufficient engagement for secure retention while remaining outside of the desired viewing area. The geometry and materials of the restraining elements 203 should be chosen to provide a restraining force sufficient to secure the specimen positively, such as 5 grams force, but small enough so as not to jeopardize damaging the specimen, such as not more than 20 grams force.

FIG. 7 is an isometric view of specimen holder 225 shown in FIGS. 5 and 6 affixed to cylindrical shaft 220. Cylindrical shaft 220 has an axis parallel to the plane of specimen support and may be used to insert specimen holder 225 into the column of a microscope system such as a charged particle beam device. As will be appreciated by those of skill in the art, specimen holder 230 described in connection with FIG. 8 may be attached to cylindrical shaft 220 instead of specimen holder 225. Those skilled in the art of electron microscopy will recognize the benefits of this arrangement of a restraining mechanism such as specimen holder 225 or 230 and a cylindrical shaft 220. Namely, these embodiments provide the aforementioned conveniences in loading a specimen, secure restraint of a specimen, and unobstructed viewing capability of the specimen area under a wide range of tilt angles about the primary axis of the shaft 220, which axis is normally provided with a tilting mechanism in commercial microscopes.

FIG. 8 is a top plan view of specimen holder 230 in accordance with an alternate embodiment of the present invention. Specimen holder 230 includes supporting surface 200, restraining elements 203, springs 210 (not shown in FIG. 8), and fingers 211, all as described in connection with FIGS. 5 and 6. However, in specimen holder 230, restraining elements 203 are withdrawn from supporting surface 200 by way of rotation thereof about an axis provided by attachment devices 212, such as a shoulder-screw or the like. Rotation of the restraining elements 203 occurs in a horizontal plane that is substantially parallel to the horizontal plane in which supporting surface 200 lies from a first withdrawn position illustrated in chain line in FIG. 8, to a second encroaching position in which the specimen is restrained, illustrated fully in FIG. 8. To accommodate such rotation, grooves 206 (as shown in FIG. 5) are relieved on one side to form grooves 206', as shown in FIG. 8. The relief of grooves 206' forms annular stop surface 207, analogous to the wall of groove 206, which provides a stop for which the rotation of restraining elements 203 in this embodiment. Restraining elements 203 are provided with slots 213 in the body thereof which allow restraining elements 203 to engage and disengage from screws 209 or a similar engagement device such as a pin, bayonet-clamp, cam or wedge. When engaged, the engagement devices such as screws 209 provide a downward force on restraining elements 203, which in turn provide a downward force as described in connection with FIGS. 5 and 6. Specimen holder 230 also includes edges 201A and 201B extending vertically from a top surface of supporting surface 200, and conical portions 202 extending from the top of edges 201A and 201B. As seen in FIG. 8, edges 201A and 201B are located on supporting surface 200 in a position that allows restraining elements 203 to be rotated in the manner described. A similar embodiment may omit springs 210 (not shown in FIG. 8), and may instead use a compliant material for restraining elements 203, thereby combining the spring 210 and the restraining element 203 into a single part. Another similar embodiment may simply omit the springs 210.

The terms and expressions which have been employed herein are used as terms of description and not as limitation, and there is no intention in the use of such terms and expressions of excluding equivalents of the features shown and described or portions thereof, it being recognized that various modifications are possible within the scope of the invention claimed. Although particular embodiments of the present invention have been illustrated in the foregoing detailed description, it is to be further understood that the present invention is not to be limited to just the embodiments disclosed, but that they are capable of numerous rearrangements, modifications and substitutions.

What is claimed is:

1. A specimen holding apparatus, comprising:
   a main body having a longitudinal axis extending between a first end and a second end of said main body;
   a specimen supporting surface provided on said main body; and
   a restraining element axially displaceable along said main body in relation to said longitudinal axis from a first position in which said restraining element is retracted from said specimen supporting surface to a second position in which said restraining element slidably encroaches over a perimeter of said specimen supporting surface.

2. A specimen holding apparatus according to claim 1, said main body having a groove provided therein, said restraining element resting within and being axially displaceable within said groove.

3. A specimen holding apparatus according to claim 1, said restraining element having a slot extending along a body portion thereof, said specimen holding apparatus further comprising an attachment device extending through said slot and into said main body, said slot and said attachment device limiting the motion of said restraining element along said main body.

4. A specimen holding apparatus according to claim 3, further comprising a biasing element provided between said restraining element and said main body, said attachment device being adapted to selectively apply a force on said restraining element in a direction generally perpendicular to a top surface of said main body and in opposition to a force provided by said biasing element.

5. A specimen holding apparatus according to claim 4, said restraining element having a plurality of fingers, said fingers encroaching over said perimeter of said specimen supporting surface when said restraining element is in said second position.

6. A specimen holding apparatus according to claim 5, wherein said fingers are flexible.

7. A specimen holding apparatus according to claim 3, further comprising a first edge extending vertically from a first side of said supporting face and a second edge extending vertically from a second side of said supporting face, said first and second sides being opposite one another, a second direction between a center point of said first edge and a center point of said second edge being substantially perpendicular to said longitudinal axis of said main body.

8. A specimen holding apparatus according to claim 7, said first and second edges each having first and second conical portions extending from opposite ends thereof, said first and second conical portions defining a cut out region therebetween.

9. A specimen holding apparatus according to claim 1, said main body having a hole therethrough, said hole being located within an area defined by said specimen supporting surface.

10. A specimen holding apparatus according to claim 2, said restraining element having a slot extending along a body portion thereof, said specimen holding apparatus further comprising an attachment device extending through said slot and into said main body, said slot and said attachment device limiting the motion of said restraining element along said main body.

11. A specimen holding apparatus according to claim 10, further comprising a biasing element provided between said restraining element and said main body, said attachment device being adapted to selectively apply a force on said restraining element in a direction generally perpendicular to a top surface of said main body and in opposition to a force provided by said biasing element.

12. A specimen holding apparatus according to claim 1, said restraining element having a plurality of fingers, said fingers encroaching over said perimeter of said specimen supporting surface when said restraining element is in said second position.

13. A specimen holding apparatus according to claim 12, wherein said fingers are flexible.

14. A specimen holding apparatus according to claim 1, further comprising a first edge extending vertically from a first side of said supporting face and a second edge extending vertically from a second side of said supporting face, said first and second sides being opposite one another, a second direction between a center point of said first edge and a center point of said second edge being substantially perpendicular to said longitudinal axis of said main body.

15. A specimen holding apparatus according to claim 14, said first and second edges each having first and second conical portions extending from opposite ends thereof, said first and second conical portions defining a cut out region therebetween.

16. A specimen holding apparatus according to claim 5, said restraining element having a grasping element located at an end of said restraining element opposite said fingers.

17. A specimen holding apparatus according to claim 12, said restraining element having a grasping element located at an end of said restraining element opposite said fingers.

18. A specimen holding apparatus according to claim 1, said restraining element being axially displaceable along a first side of said main body, said first side being adjacent a first side of said specimen supporting surface, said specimen holding apparatus further comprising a second restraining element axially displaceable along a second side of said main body, said second side of said main body being adjacent a second side of said specimen supporting surface opposite said first side of said specimen supporting surface.

19. A specimen holding apparatus, comprising
a main body;
a specimen supporting surface provided on said main body in a first horizontal plane; and
a restraining element attached to said main body by an attachment device, said restraining element being rotatably displaceable within a second horizontal plane substantially parallel to said first horizontal plane, said restraining element rotating between a first position in which said restraining element is retracted from said specimen supporting surface and a second position in which said restraining element encroaches over a perimeter of said specimen supporting surface.

20. A specimen holding apparatus according to claim 19, further comprising an engagement device attached to said main body for selectively engaging said restraining element in said second position.

21. A specimen holding apparatus according to claim 20, further comprising a biasing element provided between said restraining element and said main body, said engagement device being adapted to selectively apply a force on said restraining element in said second position in a direction generally perpendicular to a top surface of said main body and in opposition to a force provided by said biasing element.

22. A specimen holding apparatus according to claim 19, said restraining element having a plurality of fingers, said fingers encroaching over said perimeter of said specimen supporting surface when said restraining element is in said second position.

23. A specimen holding apparatus according to claim 22, wherein said fingers are flexible.

24. A specimen holding apparatus according to claim 19, further comprising a first edge extending vertically from a first side of said specimen supporting face and a second edge extending vertically from a second side of said specimen supporting face, said first and second sides being opposite one another.

25. A specimen holding apparatus according to claim 24, said first and second edges each having a conical portion extending from a first end thereof.

26. A specimen holding apparatus according to claim 19, said main body having a hole therethrough, said hole being located within an area defined by said specimen supporting surface.

27. A specimen holding apparatus according to claim 19, said restraining element being attached to a first side of said main body, said first side being adjacent a first side of said specimen supporting surface, said specimen holding apparatus further comprising a second restraining element attached to a second side of said main body by a second attachment device, said second side of said main body being adjacent a second side of said specimen supporting surface opposite said first side of said specimen supporting surface, said second restraining element being rotatably displaceable within said second horizontal plane, said restraining element rotating between a first position in which said second restraining element is retracted from said specimen supporting surface and a second position in which said second restraining element encroaches over a perimeter of said specimen supporting surface.

28. A specimen holding apparatus according to claim 1, said main body being attached to a cylindrical shaft, said cylindrical shaft having a longitudinal axis parallel to said longitudinal axis of said main body.

29. A specimen holding apparatus according to claim 19, said main body being attached to a cylindrical shaft said cylindrical shaft having a longitudinal axis parallel to said first horizontal plane.

* * * * *